(12) United States Patent
Meyers et al.

(10) Patent No.: US 10,578,274 B2
(45) Date of Patent: Mar. 3, 2020

(54) LENS ARRAY ASSEMBLY AND METHOD FOR MAKING THE SAME

(71) Applicant: General Electric Company, Schenectady, NY (US)

(72) Inventors: Mark Marshall Meyers, Niskayuna, NY (US); Loucas Tsakalakos, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 162 days.

(21) Appl. No.: 15/444,608

(22) Filed: Feb. 28, 2017

(65) Prior Publication Data
US 2017/0356621 A1    Dec. 14, 2017

Related U.S. Application Data

(60) Provisional application No. 62/348,291, filed on Jun. 10, 2016.

(51) Int. Cl.
*F21V 5/00* (2018.01)
*F21V 5/08* (2006.01)
(Continued)

(52) U.S. Cl.
CPC .............. *F21V 5/007* (2013.01); *F21K 9/68* (2016.08); *F21K 9/69* (2016.08); *F21K 9/90* (2013.01); *F21V 5/08* (2013.01); *F21V 13/04* (2013.01); *F21V 14/04* (2013.01); *G02B 3/005* (2013.01); *G02B 3/0012* (2013.01);
(Continued)

(58) Field of Classification Search
CPC . F21V 5/007; F21V 5/08; F21V 13/04; F21V 14/04; F21K 9/69; F21K 9/68; F21K 9/90; G08G 5/0047; G08G 5/18; H01S 5/0071; H01S 5/02415; H01S 5/0683; H01S 5/005; H01S 5/4025; G02B 19/0009; G02B 3/0012; G02B 3/005; G02B 3/0037;
(Continued)

(56) References Cited

U.S. PATENT DOCUMENTS 5,699,190 A    12/1997    Young et al.
6,842,297 B2    1/2005    Dowski, Jr.
(Continued)

OTHER PUBLICATIONS

Dillon et al., "Microlens fabrication using HEBS glass for compact high-resolution IR imaging system", 2006, 9 pages, Proc. of SPIE vol. 6327 63270B-8, Nanoengineering: Fabrication, Properties, Optics, and Devices III.
(Continued)

*Primary Examiner* — William J Carter
*Assistant Examiner* — Omar Rojas Cadima
(74) *Attorney, Agent, or Firm* — Christopher R. Carroll; The Small Patent Law Group LLC

(57) ABSTRACT

A lens array assembly includes plural lens elements each configured to receive incoming light from one or more light sources. The lens elements include biconic refractive elements on first sides of the lens elements and including diffractive elements on opposite, second sides of the lens elements. The lens elements are configured to change directions of the incoming light received from the one or more light sources such that outgoing light emanating from the lens elements is collimated in a first direction but diverges along a different, second direction.

19 Claims, 26 Drawing Sheets

(51) Int. Cl.
  G02B 27/42   (2006.01)
  G02B 3/00    (2006.01)
  G02B 19/00   (2006.01)
  F21K 9/68    (2016.01)
  F21K 9/69    (2016.01)
  F21K 9/90    (2016.01)
  F21V 13/04   (2006.01)
  F21V 14/04   (2006.01)
  G08G 5/00    (2006.01)
  H01S 5/00    (2006.01)
  H01S 5/024   (2006.01)
  H01S 5/0683  (2006.01)
  F21Y 115/30  (2016.01)
  F21W 111/06  (2006.01)

(52) U.S. Cl.
  CPC ..... *G02B 19/0009* (2013.01); *G02B 19/0057* (2013.01); *G02B 27/425* (2013.01); *G08G 5/0047* (2013.01); *H01S 5/0071* (2013.01); *H01S 5/02415* (2013.01); *H01S 5/0683* (2013.01); *F21W 2111/06* (2013.01); *F21Y 2115/30* (2016.08)

(58) Field of Classification Search
  CPC .......... G02B 3/08; G02B 3/10; G02B 27/425; G02B 19/0057; F21W 2111/06
  USPC ........... 362/326, 608, 615, 520, 217.02, 244
  See application file for complete search history.

(56) References Cited

U.S. PATENT DOCUMENTS

| | | | |
|---|---|---|---|
| 6,853,490 B2 * | 2/2005 | Wang | B41J 2/451 359/621 |
| 6,927,922 B2 | 8/2005 | George et al. | |
| 7,076,129 B2 | 7/2006 | Lemoff | |
| 7,286,295 B1 | 10/2007 | Sweatt et al. | |
| 8,393,754 B2 | 3/2013 | Song | |
| 8,629,930 B2 | 1/2014 | Brueckner et al. | |
| 8,780,446 B2 | 7/2014 | Lee et al. | |
| 8,866,168 B2 | 10/2014 | Bailey et al. | |
| 9,496,679 B2 | 11/2016 | Lee et al. | |
| 2002/0159488 A1 * | 10/2002 | Wolak | G02B 6/262 372/36 |
| 2003/0165292 A1 * | 9/2003 | Bhagavatula | G02B 6/2552 385/33 |
| 2006/0209292 A1 | 9/2006 | Dowski, Jr. et al. | |
| 2009/0190101 A1 | 7/2009 | Alasaarela et al. | |
| 2012/0162486 A1 * | 6/2012 | Asakura | G02B 3/10 348/241 |
| 2016/0223654 A1 | 8/2016 | Sparbert et al. | |
| 2017/0350965 A1 * | 12/2017 | Schmalenberg | G01S 17/10 |

OTHER PUBLICATIONS

Lu et al., "Direct write of microlens array using digital projection photopolymerization" Online publication, Applied Physicas Letteres 92, Jan. 30, 2008, 3 pages, American Institute of Physics.

Tien et al., "Microcontact Printing of SAMs", 1998, 24 pages, vol. 24, Thin Films by Academic Press, Department of Chemistry and Chemical Biology, Harvard University, Cambridge, Massachusetts.

Koshelev et al., "High refractive index Fresnel lens on a fiber fabricated by nanoimprint lithography for immersion applications" 4 pages, Opt. Lett. 41, (2016).

Wang et al., "Diffractive Optics: Nanoimprint lithography enables fabrication of subwavelength optics" Dec. 1, 2005, 6 pages, Laser Focus World, Somerset, NJ.

Wavelength Electronics "Laser Diode Driver Basics" TeamWavelength.com (4 pages).

* cited by examiner

LENS ARRAY ASSEMBLY AND METHOD FOR MAKING THE SAME

CROSS-REFERENCE TO RELATED APPLICATIONS

This application claims priority to U.S. Provisional Application No. 62/348,291, which was filed on 10 Jun. 2016, and the entire disclosure of which is incorporated herein by reference.

FIELD

The subject matter described herein relates to lens arrays, such as microlens arrays.

BACKGROUND

Various lighting assemblies use lenses in order to shape and direct light in a variety of directions and shapes. Some lighting assemblies can be used as beacons to direct aircraft into a landing area or zone. These types of lighting assemblies frequently have large and heavy light sources which require correspondingly large and heavy lenses to direct the light toward aircraft to operate as the beacon for the aircraft. Other lighting assemblies can use lenses to direct light for a variety of purposes, such as illumination, distance measurement (e.g., LIDAR), or the like.

Improvements in some lighting assemblies may seek to reduce the size and weight of the light sources, but a need still exists for lenses that are able to shape and direct light from the light sources. The lighting assemblies and lenses decrease in size, the ability to manufacture sufficiently small lenses that also can shape and direct the light across a large area to operate as an aircraft beacon, to illuminate an area, to measure distances, etc., becomes increasingly difficult.

BRIEF DESCRIPTION

In one embodiment, a lens array assembly is provided that includes plural lens elements each configured to receive incoming light from one or more light sources. The lens elements include biconic refractive elements on first sides of the lens elements and including diffractive elements on opposite, second sides of the lens elements. The lens elements are configured to change directions of the incoming light received from the one or more light sources such that outgoing light emanating from the lens elements is collimated in a first direction but diverges along a different, second direction.

In one embodiment, a method (e.g., for providing a lens array assembly) includes obtaining a grayscale photomask, applying a photoresist to a first side of an optic body, forming one or more insoluble portions in the photoresist by exposing the photoresist to a developing light through the grayscale photomask, and exposing the one or more insoluble portions in the photoresist and one or more portions of the optic body on the first side that are outside of the one or more insoluble portions of the photoresist to an etchant. The etchant forms biconic refractive surfaces in plural lens elements on the first side of the optic body. The lens elements are configured to change directions of incoming light received from one or more light sources such that outgoing light emanating from the lens elements is collimated in a first direction but diverges along a different, second direction.

In one embodiment, a lens array assembly includes plural lens elements each configured to receive incoming light from one or more light sources. The lens elements include biconic refractive elements on first sides of the lens elements and including diffractive elements on opposite, second sides of the lens elements. The lens elements are configured to form different diverging beams of the outgoing light such that the diverging beams emanating from the lens elements have different central angles.

BRIEF DESCRIPTION OF THE DRAWINGS

The present inventive subject matter will be better understood from reading the following description of non-limiting embodiments, with reference to the attached drawings, wherein below:

FIG. 3 illustrates a perspective view of another embodiment of a lens array assembly;

DETAILED DESCRIPTION

The inventive subject matter described herein provides lens array assemblies and methods for manufacturing the lens array assemblies. In one embodiment, the lens array assemblies include a segmented micro optic lens array that redirects and controls the divergence of light (e.g., laser light) in a first direction (e.g., the horizontal direction), while collimating the light in a different, second direction (e.g., the vertical direction). The lens array assembly utilizes an array of N light sources (e.g., laser diodes), where the beams of light generated by the light sources is collimated in the second direction (e.g., the vertical direction) and diverges as 1/Nth of the full angular range in the first direction (e.g., the horizontal direction). The micro lens array assembly is configured to have progressively larger horizontal element decentration on lens elements (also referred to as lenslets) as one moves radially away from the center of the array. This causes the axial ray from light sources progressively farther from the center to be deflected at larger angles. By deflecting the beams towards the center, the required size of a scanning mirror that reflects the light is greatly reduced, which makes the assembly compatible with the integrated photonic manufacturing approach on much smaller scales (e.g., sizes) than is currently available.

Figure 2:
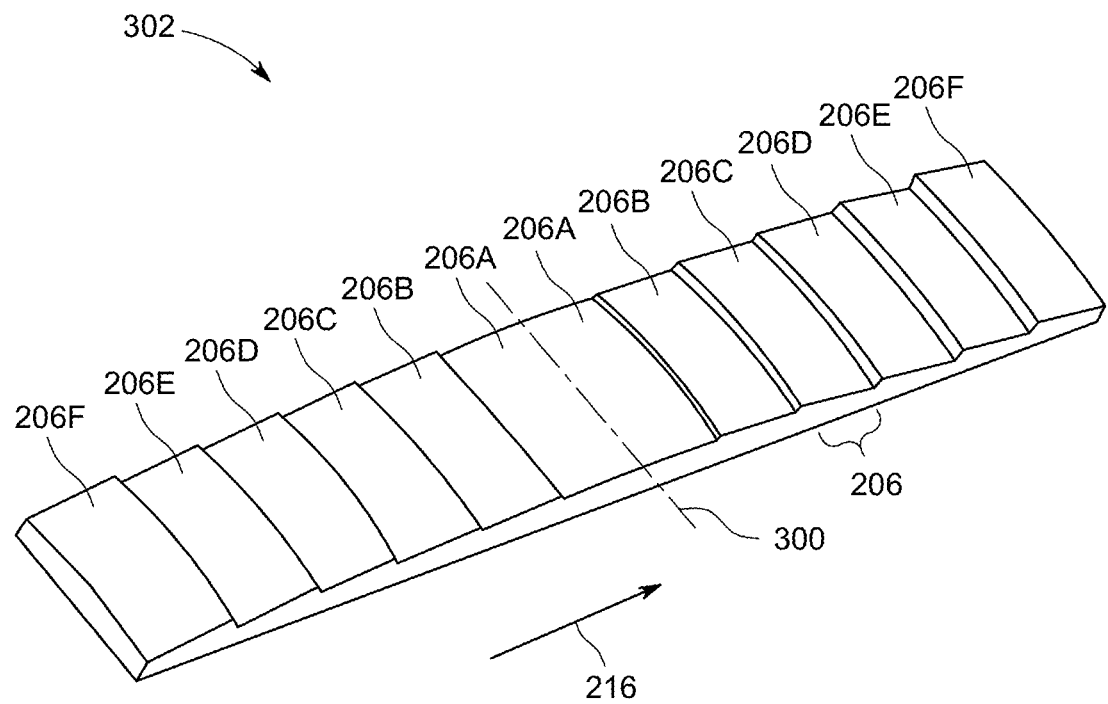

FIG. 2 illustrates a lighting assembly 200 that is included in a lighting system and that includes one embodiment of a lens array assembly 202. One or more lighting assemblies 200 can be used in a lighting system to generate light for operating as a beacon for aircraft. The lighting system uses the lens array assemblies to direct light into a pyramid or other shape. The aircraft can then use the light to determine where to land on a surface. Alternatively, the lighting system includes the lighting assembly or assemblies for one or more other purposes.

The lighting assembly 200 includes several light sources 204 that generate light toward the lens array assembly 202. These light sources 204 can be photodiodes and/or laser diodes that generate different beams of light into different areas of the lens array assembly 202. For example, the lens array assembly 202 can include multiple micro lenses 206 that each receives light from a different light source 204. In the illustrated embodiment, the lens array assembly 202 includes nine lens elements, or lenses, 206. Alternatively, the lens array assembly 202 can include a single lens element 206 or a different number of lens elements 206. For example, the lens array assembly 202 can have twelve lens elements 206.

The light sources 204 can all generate light having the same or substantially the same (e.g., within 3%) wavelength, such as 1570 nanometers. This light is received by the lens elements 206 into or through a back surface or side 210 of each lens element 206. The light that is generated by the light sources 204 and received by the lens elements 206 can be referred to as incoming light. The light passes through the lens elements 206, is collimated, diffracted, and/or refracted by the lens elements 206, and exits or emanates from opposite front surfaces or sides 212 of the lens elements 206 as outgoing light. Current driving circuitry 208 can control the light output by each light source 204. Optionally, another type of light source 204 can be used, or at least one of the light sources 204 can generate light that is received by two or more of the lens elements 206.

As described below, the lens elements 206 include biconic refractive surfaces (also referred to as biconic refractive elements) on the front sides 212 of the lens elements 206 and diffractive surfaces (also referred to as diffractive elements) on the opposite, back sides 212 of the lens elements 206. The lens elements 206 are configured to change directions of the incoming light received from the light sources 204 such that the outgoing light emanating from the front surfaces or sides 212 of the lens elements 206 is collimated in a first direction but diverges along a different, second direction. For example, this outgoing light may be collimated along or in a vertical direction 214 but diverge or spread out in an orthogonal direction, such as a horizontal direction 216 in which the lens elements 206 are arranged side-by-side.

Figure 1:
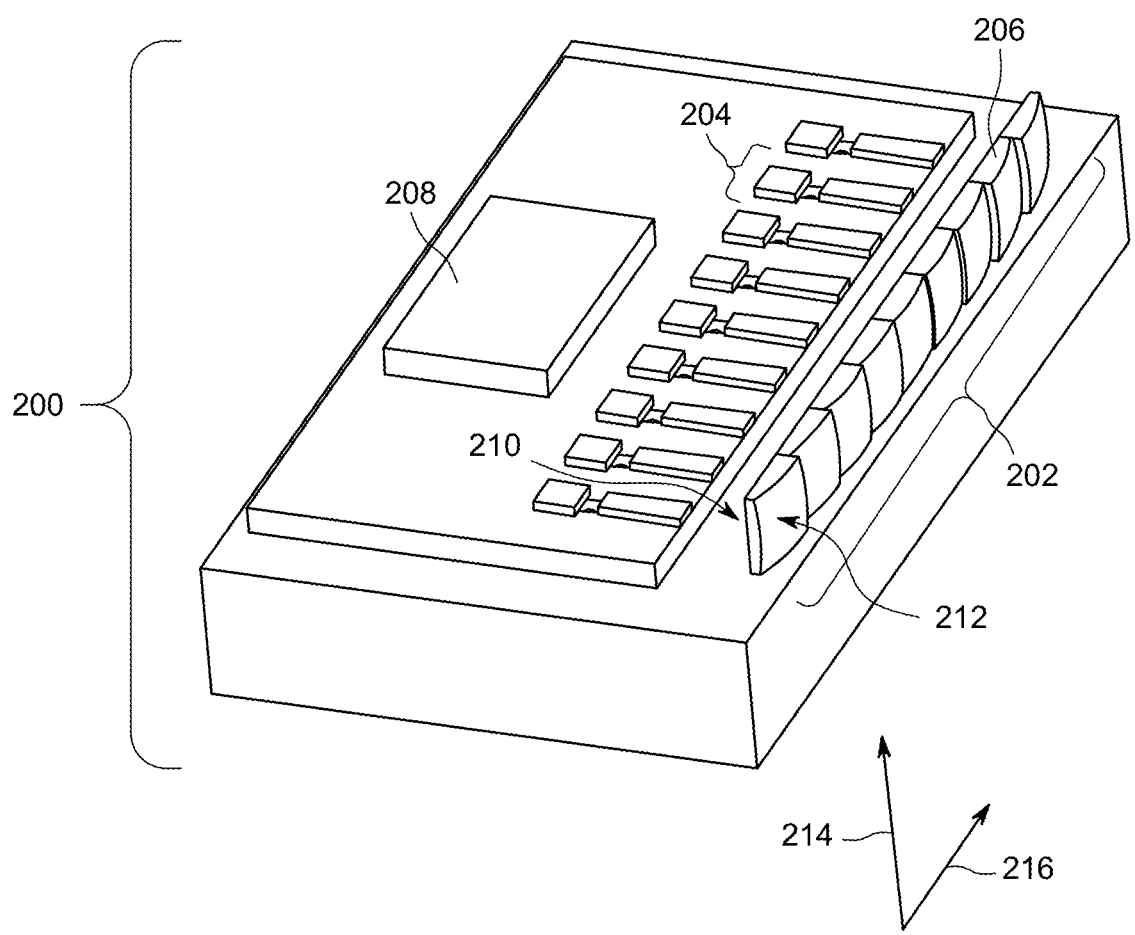
FIG. 1 illustrates a lighting assembly that is included in a lighting system and that includes one embodiment of a lens array assembly.

FIG. 2 illustrates a perspective view of one embodiment of a lens array assembly 302. The lens array assembly 302 may be used in place of the lens array assembly 202 in the lighting assembly 200 shown in FIG. 1. One difference between the lens array assemblies 202, 302 is that the lens array assembly 302 includes twelve lens elements 206 (e.g., lens elements 206A-F), while the lens array assembly 202 includes nine lens elements 206. Similar to the lens array assembly 202, the lens elements 206 in the lens array assembly 302 are arranged side-by-side along the horizontal direction 216.

The lens elements 206 can be arranged in different groups. For example, one group of lens elements 206 can include one of each of the lens elements 206A-F and another group of the lens elements 206 can include another one of each of the lens elements 206A-F. As a result, the lens elements 206 in the lens array assembly 302 are arranged in groups that are symmetrical about a center line 300 of the lens array assembly 302.

Figure 3:
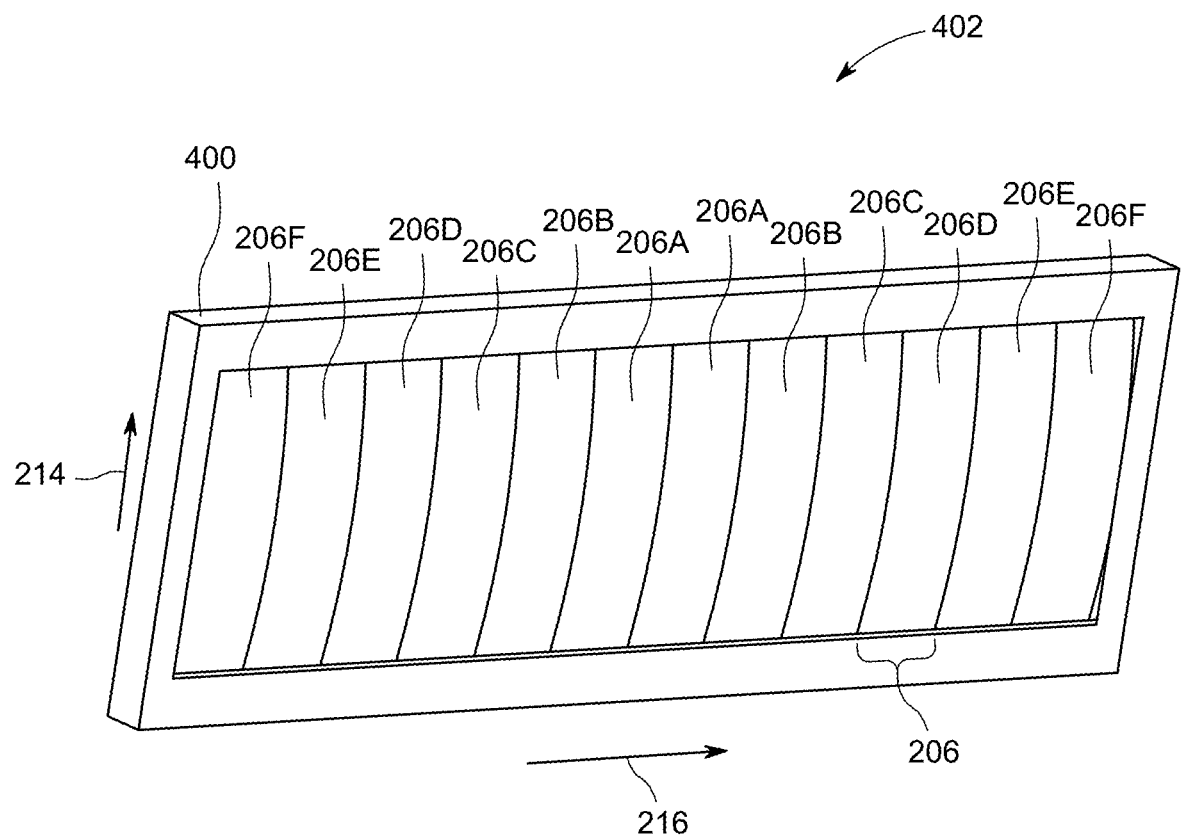
FIG. 3 illustrates a perspective view of one embodiment of a lens array assembly.

FIG. 3 illustrates a perspective view of another embodiment of a lens array assembly 402. The lens array assembly 402 may be used in place of the lens array assembly 202 in the lighting assembly 200 shown in FIG. 1. One difference between the lens array assemblies 202, 302 shown in FIGS. 1 and 2 and the lens array assembly 402 is that the lens array assembly 402 includes a border or frame 400 extending around or encircling the lens elements 206 in the lens array assembly 402.

Similar to the lens array assembly 302, the lens elements 206 can be arranged in different groups in the lens array assembly 402. For example, one group of lens elements 206 can include one of each of the lens elements 206A-F and another group of the lens elements 206 can include another one of each of the lens elements 206A-F. As a result, the lens elements 206 in the lens array assembly 402 are arranged in groups that are symmetrical about a center line 300 of the lens array assembly 402.

The lens array assemblies 202, 302, 402 may be formed from silicon or another material. As described below, the lens array assemblies 202, 302, 402 can be formed by applying a photoresist to a silicon body, exposing the photoresist to light (e.g., ultraviolet light) through a gray-scale mask to form insoluble portions of the photoresist, and exposing the insoluble portions of the photoresist and portions of the silicon body outside of the insoluble portions of the photoresist. Each lens element 206 can be relatively small. For example, each lens element 206 can have a width dimension measured along the horizontal direction 216 that is no more than 2.2 millimeters and a height dimension measured along the vertical direction 214 that is no more than 3.4 millimeters. Optionally, the lens elements 206 may have a larger width dimension and/or height dimension.

The lens elements 206 in the lens array assemblies 202, 302, 402 change the shape of the light received from the light sources 204 (shown in FIG. 1) such that the light exiting the lens elements 206 has a different shape. In one embodiment, the shape of the light is changed by the rear and front surfaces 210, 212 of different lens elements 206 in different ways. For example, the lens elements 206A can change the shape of the light in a first direction or shape, the lens elements 206B can change the shape of the light in a different, second direction or shape, and so on. The lens elements 206A can change the shape or direction of the light in the same direction or shape, the lens elements 206B can change the shape or direction of the light in the same direction or shape, and so on.

Figure 4:
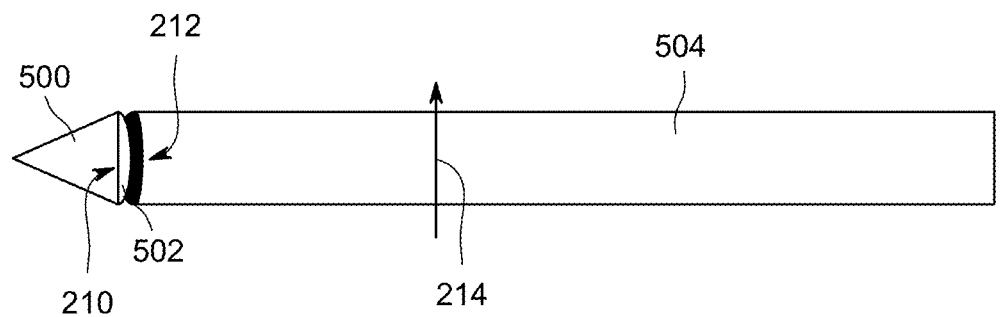
FIG. 4 illustrates one example of the light emanating from the lens elements shown in FIG. 1 of the lens array assemblies along a vertical direction.
Figure 5A:
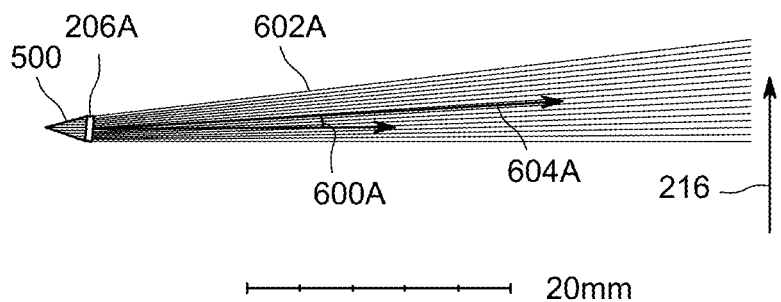
FIG. 5A illustrates an example of light emanating from a lens element along a horizontal direction.
Figure 5B:
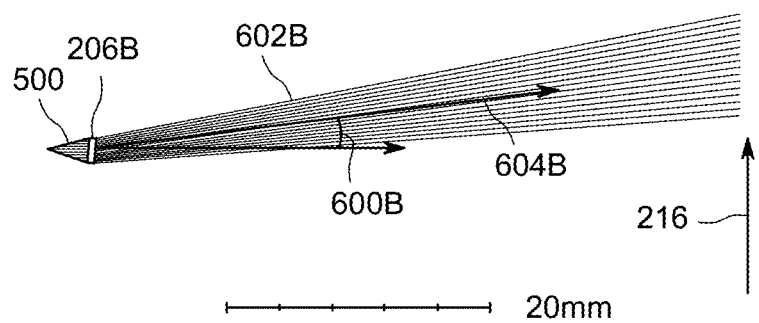
FIG. 5B illustrates an example of light emanating from another lens element along the horizontal direction.
Figure 5C:
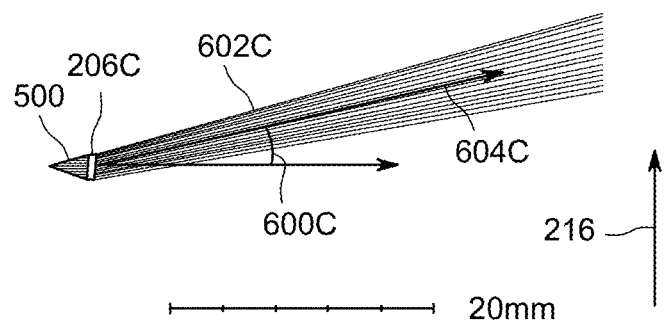
FIG. 5C illustrates an example of light emanating from another lens element along the horizontal direction.
Figure 5D:
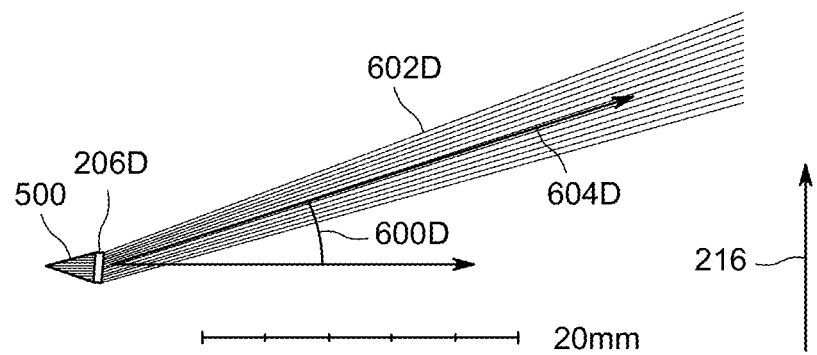
FIG. 5D illustrates an example of light emanating from another lens element along the horizontal direction.
Figure 5E:
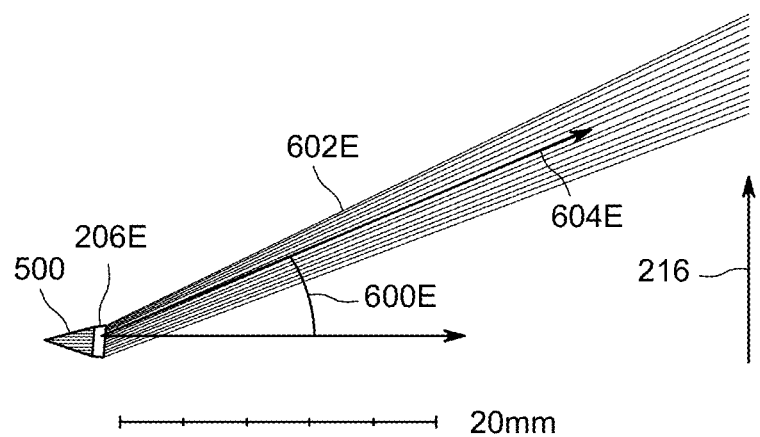
FIG. 5E illustrates an example of light emanating from another lens element along the horizontal direction.
Figure 5F:
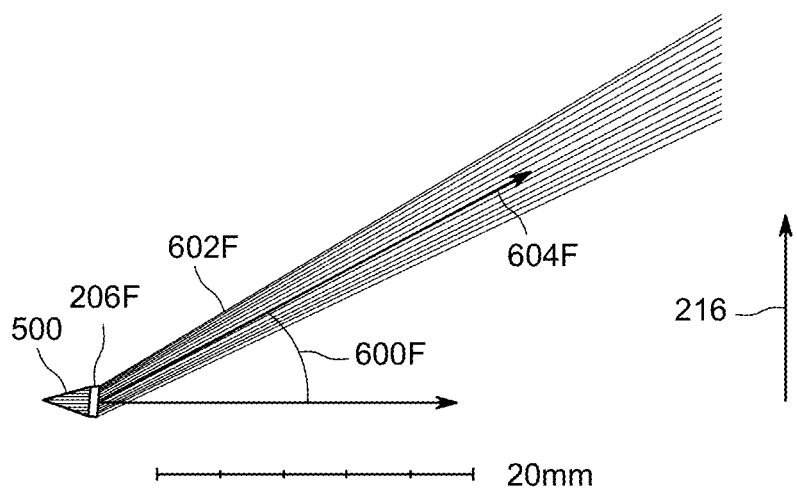
FIG. 5F illustrates an example of light emanating from another lens element along the horizontal direction.

FIG. 4 illustrates one example of the light emanating from the lens elements 206 (shown in FIG. 1) of the lens array assemblies 202, 302, 402 along the vertical direction 214. A lens array assembly 502 in FIG. 4 represents the lens array assembly 202, the lens array assembly 302, or the lens array assembly 402. The lens elements 206 in the lens array assembly 502 receive incoming light 500 from the light sources 204 (shown in FIG. 1). The back surfaces 210 of the lens elements 206 diffract the incoming light 500 for achromatization and aberration correction in the incoming light 500. The front surfaces 212 of the lens elements 206 refract the light passing through the lens elements 206 to collimate the light along the vertical direction 214. For example, the incoming light 500 is diffracted and refracted by each lens element 206 to form a vertically collimated light beam as outgoing light 504 that emanates from the front surfaces 212 of the lens elements 206, as shown in FIG. 4. The outgoing light 504 is collimated in that all or substantially all (e.g., at least 95%, at least 97%, or at least 99%) of the outgoing light 504 is directed in a parallel, non-spreading or non-diverging direction when viewed along the vertical direction 214. In one embodiment, the outgoing light 504 is vertically collimated such that the light is contained within (and does not substantially extend outside of) a dimension of no more than 3.4 millimeters.

Conversely, the lens elements 206 can diffract the incoming light 500 so that the outgoing light 504 diverges or spreads out in the horizontal direction 216. Different lens elements 206 can diverge the portion of the incoming light 500 received by each lens element 206 differently so that the beams of the outgoing light 504 from each lens element 206A-F is oriented in a different direction.

FIGS. 5A-F illustrate examples of the light emanating from the lens elements 206 (shown in FIG. 1) of the lens array assemblies 202, 302, 402 along the horizontal direction 216. Each of FIGS. 5A through 5F illustrates the portion of the outgoing light 504 emanating from a different one of the lens elements 206A through 206F. The rear surfaces 210 of the lens elements 206 include or are diffractive surfaces with linear grating, optical power, and aspheric terms. The grating can reduce the depth to which a body that is etched to form the lens elements 206 relative to lens elements that do not include such a grating.

As shown in FIGS. 5A-F, each lens element 206A-F diffracts the outgoing light 504 so that the beam or portion of the outgoing light 504 coming from each lens element 206A-F is oriented along a different central angle 600A-F relative to the front surfaces 212 of the lens elements 206A-F. For example, the lens element 206A can diffract the incoming light 500 so that a diverging beam 602A of the outgoing light 504 is oriented (e.g., centered) along a center direction 604A at a first central angle 600A, the lens element 206B can diffract the incoming light 500 so that a diverging beam 602B of the outgoing light 504 is oriented along a different center direction 604B at a larger second central angle 600B, the lens element 206C can diffract the incoming light 500 so that a diverging beam 602C of the outgoing light 504 is oriented along a different center direction 604C at a larger third central angle 600C, and so on. The central angle 600F of the lens element 206F is 27.5 degrees, the central angle 600E of the lens element 206E is 22.5 degrees, the central angle 600D of the lens element 206D is 17.5 degrees, the central angle 600C of the lens element 206C is 12.5 degrees, the central angle 600B of the lens element 206B is 7.5 degrees, and the central angle 600A of the lens element 206A is 2.5 degrees in one embodiment. Alternatively, one or more different central angles 600 can be used.

As shown in FIGS. 5A-F, the portion of the outgoing light 504 emanating from each lens element 206A-F can continue to diverge or spread away from the corresponding center direction 604 at distances that are farther from the lens element 206. While the outgoing light 504 coming out from each lens element 206A-F can be collimated along the vertical direction 214 such that the outgoing light 504 does not diverge or spread out along the vertical direction 214 after leaving the front surfaces 212 of the lens elements 206A-F, the outgoing light 504 can spread out, or diverge, along the horizontal direction 506. In one embodiment, the outgoing light 504 diverges along a sixty-degree angle as the outgoing light 504 emanates from the front surfaces 212 of the lens elements 206A-F. Alternatively, the outgoing light 504 diverges along or within a smaller or larger angle.

Figure 6:
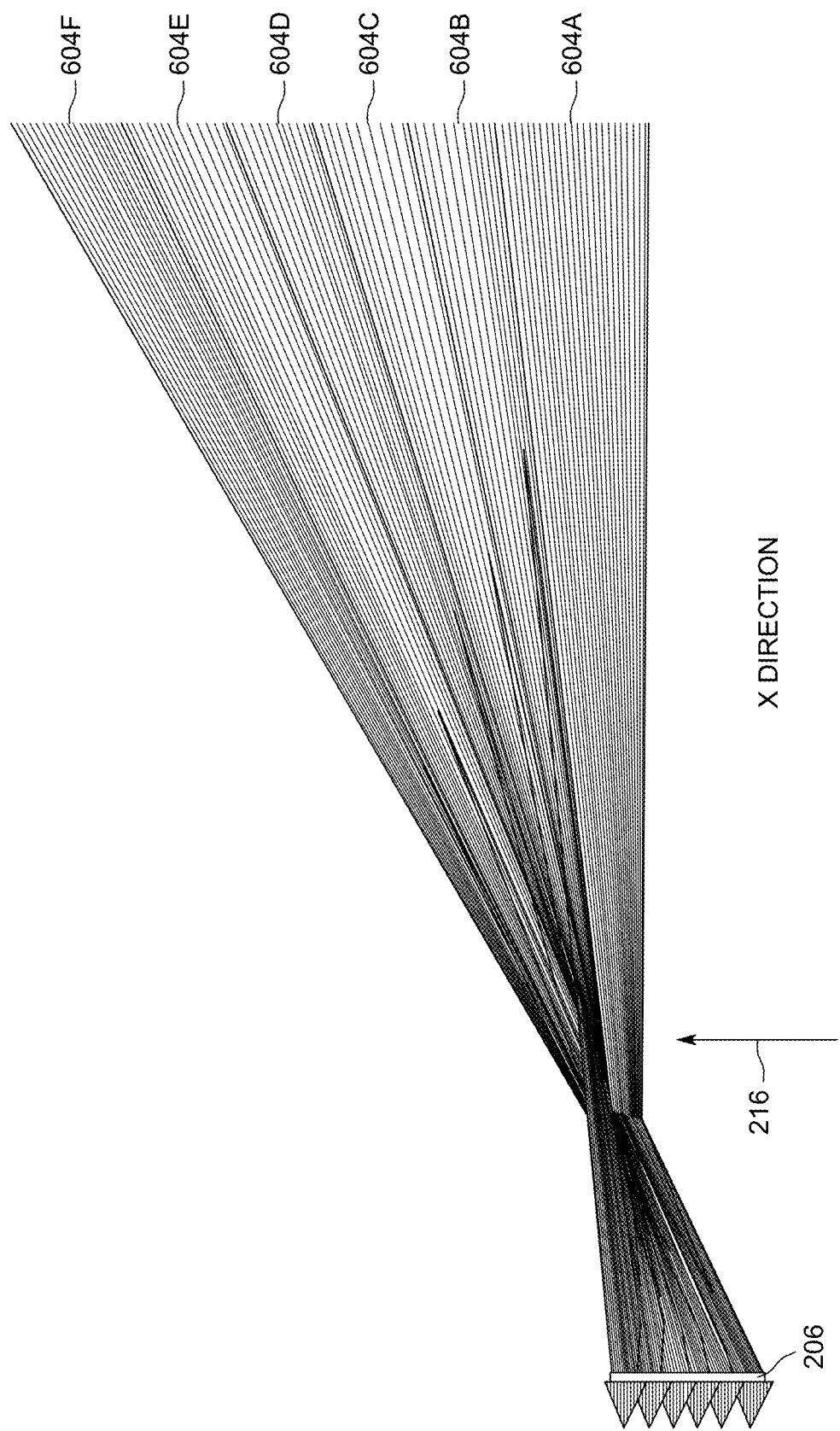
FIG. 6 illustrates outgoing light emanating from a group of the lens elements according to one embodiment.
Figure 7:
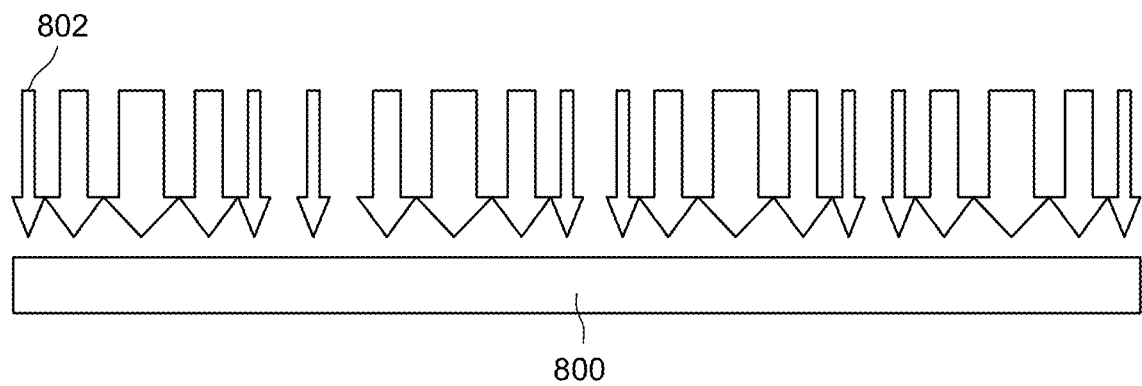
FIG. 7 illustrates the lens array assembly shown in FIGS. 2 and 3 at one stage of manufacture according to one embodiment.
Figure 8:
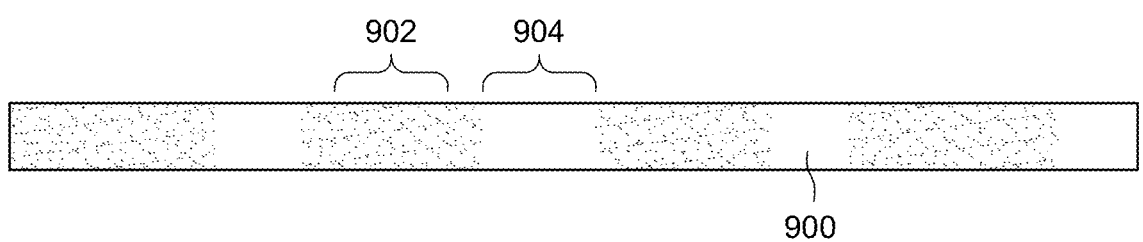
FIG. 8 illustrates the lens array assembly shown in FIGS. 2 and 3 at another stage of manufacture according to one embodiment.
Figure 9:
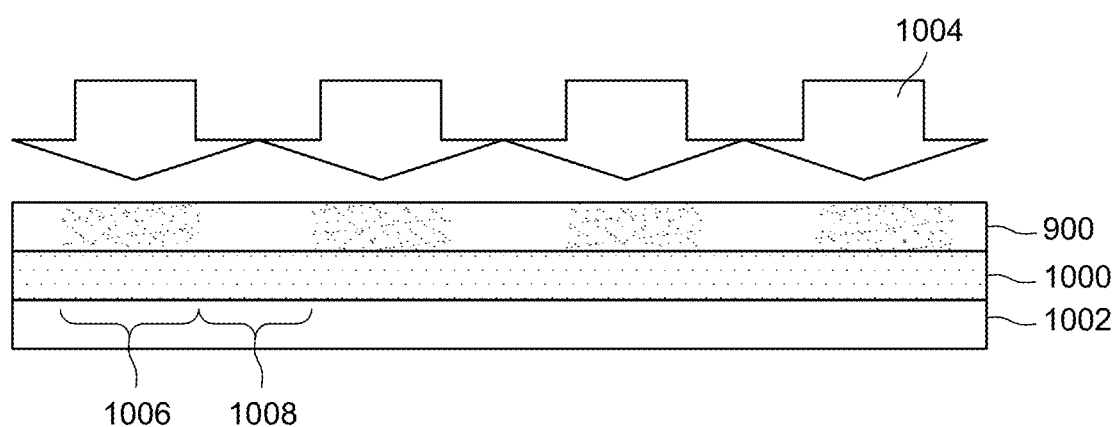
FIG. 9 illustrates the lens array assembly shown in FIGS. 2 and 3 at another stage of manufacture according to one embodiment.
Figure 10:
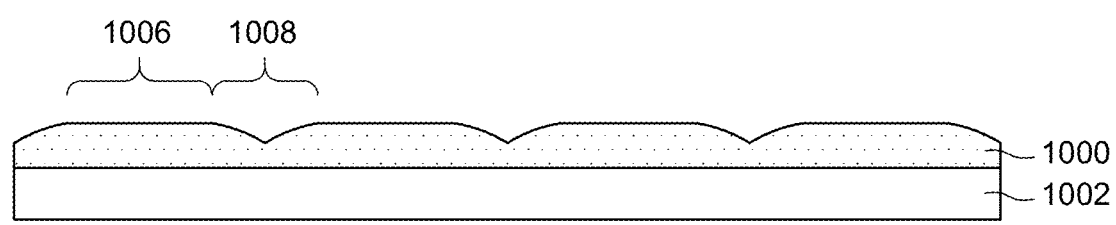
FIG. 10 illustrates the lens array assembly shown in FIGS. 2 and 3 at another stage of manufacture according to one embodiment.

FIG. 6 illustrates the outgoing light 504 emanating from a group of the lens elements 206A-F according to one embodiment. The outgoing light 504 illustrates the combined distribution or spread of the light emanating from the group of lens elements 206A-F along the horizontal direction 216. The location of the lens elements 206 and the orientation of the different center directions 604 of the outgoing light 504 from each lens element 206 can result in the portion of the outgoing light 504 from one or more lens elements 206 overlapping or crossing the portion of the outgoing light 504 from one or more other lens elements 206 before the focal point of the light, as shown in FIG. 6. The combination of the vertically collimated outgoing light 504 (shown in FIG. 4) and the horizontally diverging or spread outgoing light 504 (shown in FIG. 4) can create a linear shape of light, such as one of several lines of light generated by the lighting system described above. As shown in FIG. 6, the portion of the outgoing light 504 emanating from each lens elements 206A-F only partially overlaps (e.g., by three degrees or less) the portion of the outgoing light 504 emanating from the neighboring lens element 206 or each of the portions of the outgoing lights 504 emanating from the neighboring lens elements 206 on each side of the lens element 206. This overlap occurs after the portions of outgoing light 504 have crossed over each other.

As shown in FIGS. 2 and 3, multiple sets or groups of the lens elements 206A-F are included in the lens array assembly 402 in one embodiment. Each group or set of the lens elements 206A-F can create a different portion of the horizontally spread out outgoing light 504 shown in FIG. 6. For example, another group or set of the lens elements 206A-F can create another outgoing light 504 shown in FIG. 6, but that is on one side of the outgoing light 504 shown in FIG. 6.

FIGS. 7 through 12 illustrate the lens array assembly 302, 402 shown in FIGS. 2 and 3 at various stages of manufacture according to one embodiment. With continued reference to FIGS. 7 through 12, FIG. 13 illustrates a flowchart of one embodiment of a method 1400 for providing the lens array assembly 302, 402. At 1402, a glass body 800 (shown in FIG. 7) is exposed to electron beams 802 (shown in FIG. 7) to form a grayscale photomask 900 (shown in FIG. 8). The glass body 800 can be a planar sheet of high energy beam selective (HEBS) glass. The photomask 900 can have portions 902 that are more transparent to a photoresist curing light, such as ultraviolet light, and other portions 904 that are less transparent to the curing light. The locations in the photomask 900 that are more transparent to the curing light can represent the areas of the glass body 800 that is to be etched or removed from the glass body 800 to form the lens elements 206 (shown in FIG. 1) less than the locations in the photomask 900 that are less transparent to the curing light.

At 1404, a photoresist 1000 is applied to an optic body 1002. The photoresist 1000 can be applied in an even or substantially even thickness (e.g., within manufacturing tolerances of the components used to apply the photoresist 1000). The optic body 1002 may be a sheet or planar body of a material that receives, diffracts, and refracts light as described herein. In one embodiment, the optic body 1002 is a sheet of silicon. Alternatively, the optic body 1002 is formed from another material, such as a glass or polymer. The optic body 1002 is relatively thin prior to etching (described below). For example, the optic body 1002 can be formed from a sheet of silicon that is no thicker than one millimeter. Alternatively, a thicker or thinner optic body 1002 can be used.

At 1406, the photoresist 1000 is developed. Developing the photoresist 1000 can include positioning the photomask 900 between the photoresist 1000 and a source of curing light 1004, such as an ultraviolet light source. The curing light 1004 passes through the photomask 900 and is attenuated different amounts by the photomask 900 depending on how much of the photomask 900 was removed in various areas at 1402. For example, portions 1006 of the photoresist 1000 that are between the areas of the photomask 900 that attenuate little to none of the curing light are cured and become insoluble portions 1006 of photoresist 1000. Portions 1008 of the photoresist 1000 that are between the areas of the photomask 900 that attenuate a significant portion or all of the curing light are not cured. These portions 1008 of the photoresist 1000 remain soluble.

The soluble portions 1008 of the photoresist 1000 can be removed by exposing the insoluble portions 1006 and soluble portions 1008 of the photoresist 1000 to a solvent. The solvent can remove the soluble portions 1008 of the photoresist 1000 so that only the insoluble portions 1006 remain.

Figure 11:
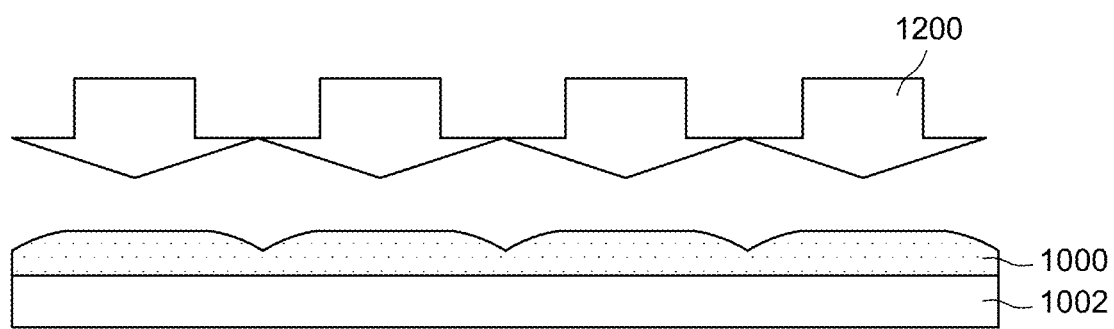
FIG. 11 illustrates the lens array assembly shown in FIGS. 2 and 3 at another stage of manufacture according to one embodiment.
Figure 12:
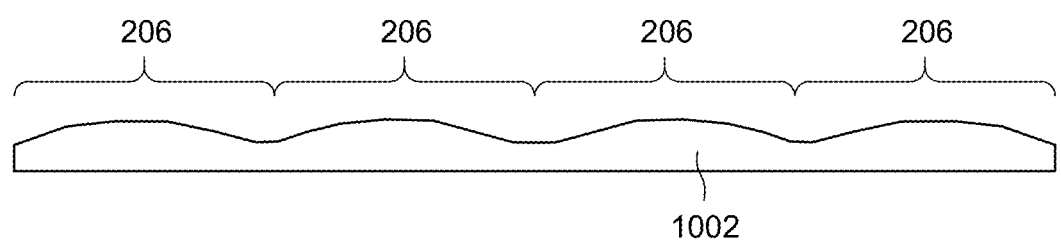
FIG. 12 illustrates the lens array assembly shown in FIGS. 2 and 3 at another stage of manufacture according to one embodiment.
Figure 13:
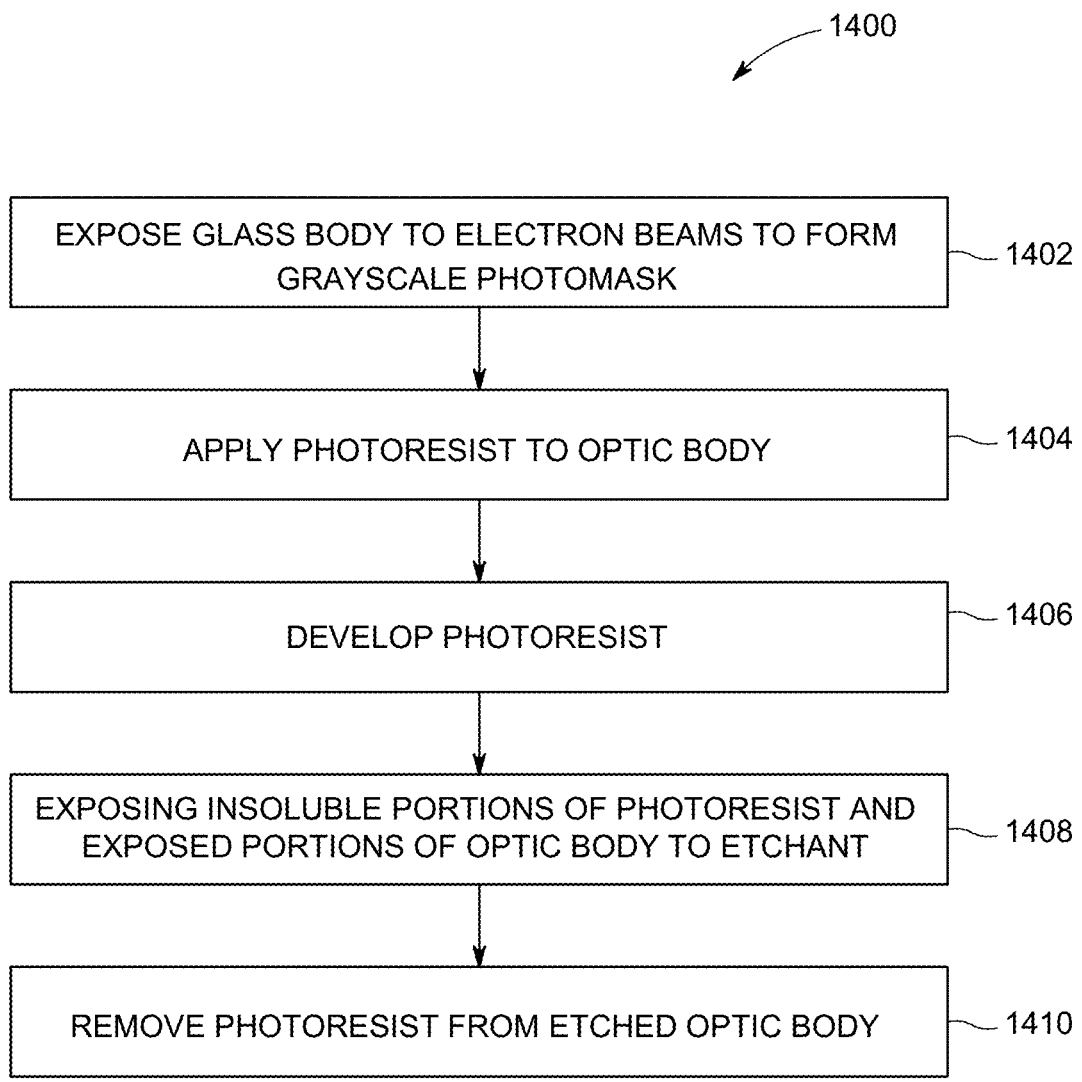
FIG. 13 illustrates a flowchart of one embodiment of a method for providing the lens array assemblies shown in FIGS. 2 and 3.

At 1408, the insoluble portions 1006 of the photoresist 1000 and the optic body 1002 are exposed to an etchant 1200, as shown in FIG. 11. In one embodiment, the etchant 1200 is a plasma etch, but optionally can be a chemical or other type of etchant. The etchant 1200 can remove portions of the optic body 1002 that are beneath or that were beneath the soluble portions 1008 of the photoresist 1000. The etchant 1200 also can remove portions of the insoluble portions 1006 of the photoresist 1000. The etchant 1200 removes portions of the optic body 1002 to form the lens elements 206 described above, as shown in FIG. 13. Optionally, a laser etch can be used to form the lens elements 206 instead of or in addition to the photoresist etch technique described above.

The process described above can be repeated for the other surface of the optic body 1002. For example, the method 1400 can be performed once for one side of the optic body 1002 to form the front surfaces 212 of the lens elements 206 using a first photomask 900, and the method 1400 can be repeated for the other, opposite side of the optic body 1002 to form the rear surfaces 210 of the lens elements 206 using a different, second photomask 900.

The amount of material of the optic body 1002 that is removed to form the front and rear surfaces 212, 210 of the lens elements 206 is relatively small. For example, no more than 62.5 microns is removed from the optic body 1002 to form the lens elements 206 in one embodiment. Alternatively, a larger or smaller amount of the optic body 1002 can be removed. For example, no more than 32 microns can be removed from one side of the optic body 1002 to form the front surfaces 212 of the lens elements 206 and no more than 3.2 microns can be removed from the opposite side of the optic body 1002 to form the rear surfaces 210 of the lens elements 206 in another embodiment.

Figure 14:
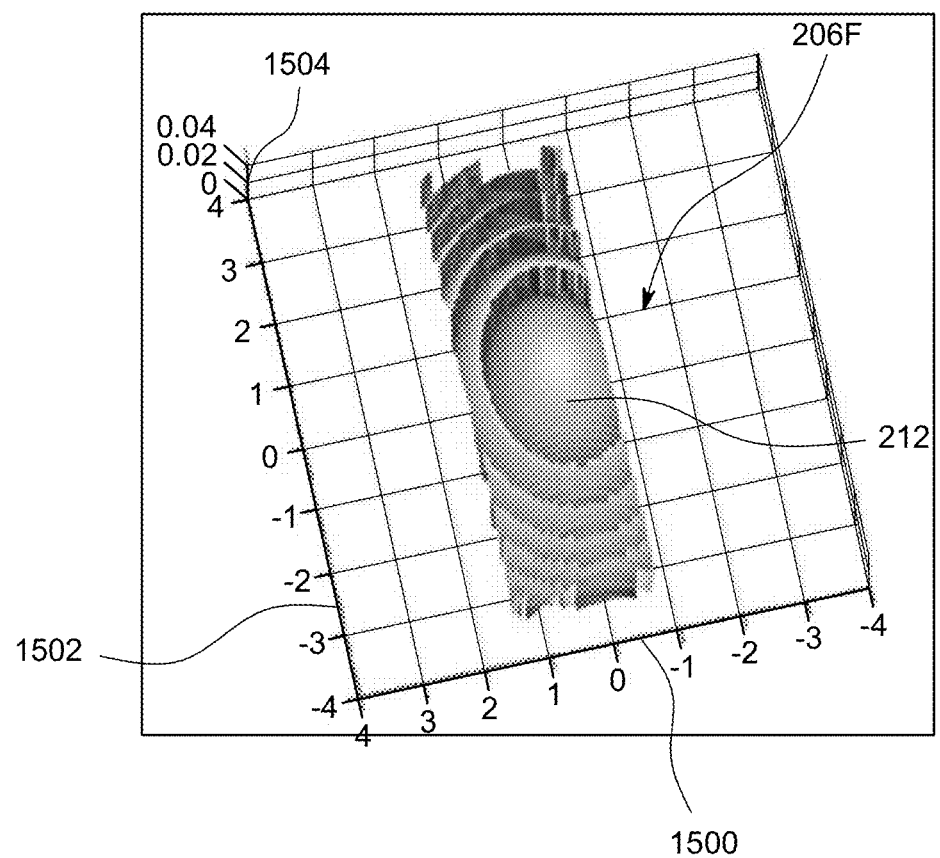
FIG. 14 illustrates a front surface of one lens element according to one example.
Figure 15:
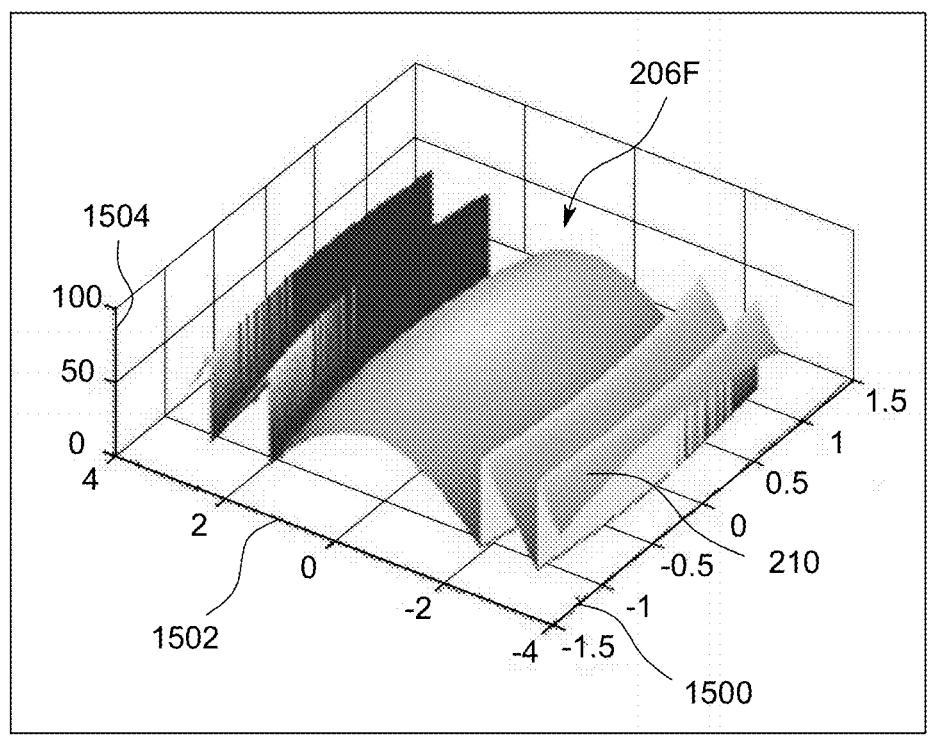
FIG. 15 illustrates a rear surface of the lens element shown in FIG. 14 according to one example.
Figure 16:
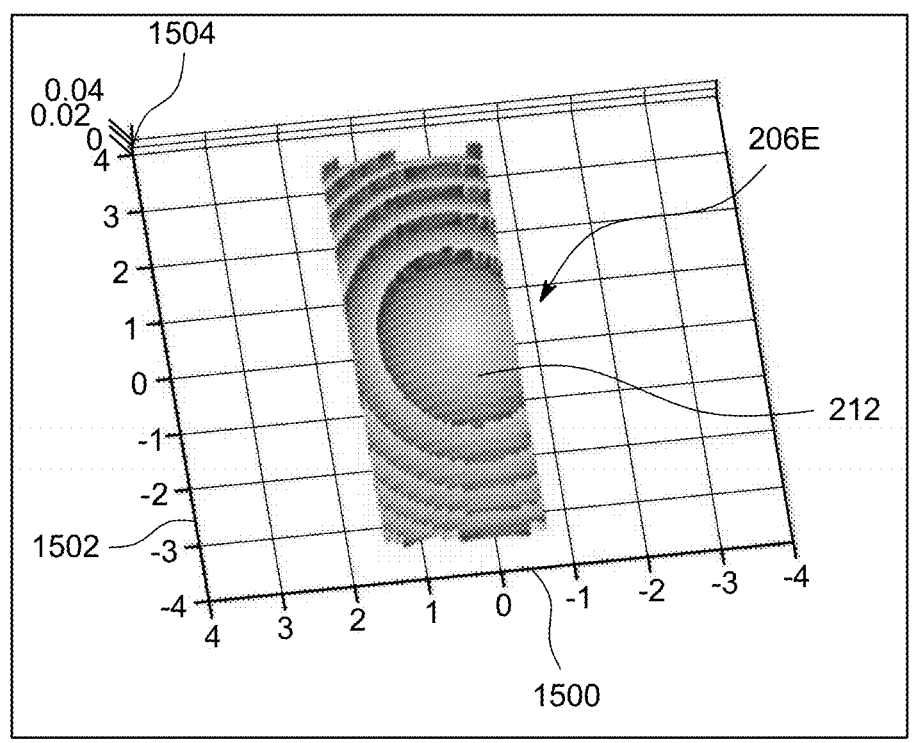
FIG. 16 illustrates a front surface of another lens element according to one example.
Figure 17:
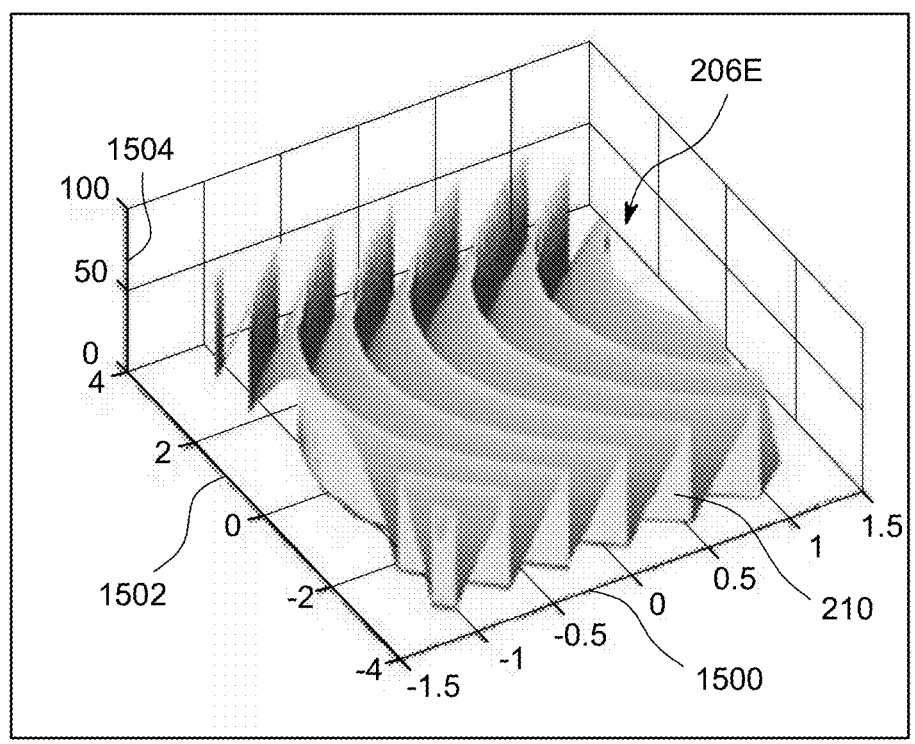
FIG. 17 illustrates a rear surface of the lens element shown in FIG. 16 according to one example.
Figure 18:
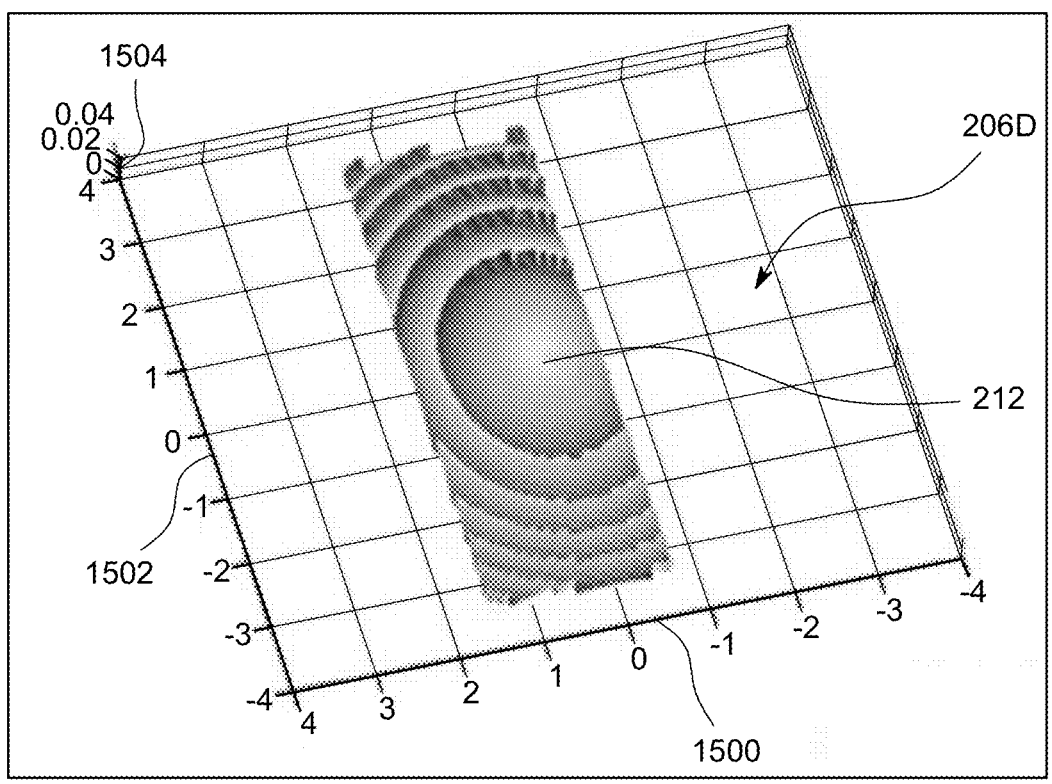
FIG. 18 illustrates a front surface of another lens element according to one example.
Figure 19:
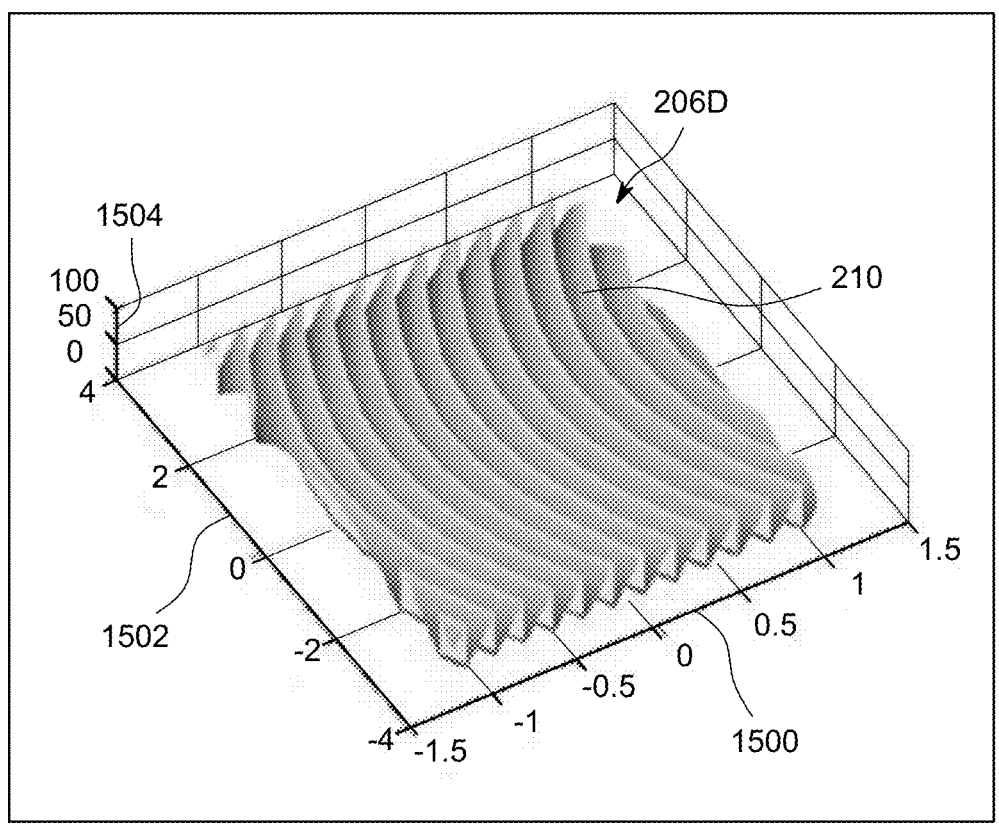
FIG. 19 illustrates a rear surface of the lens element shown in FIG. 18 according to one example.
Figure 20:
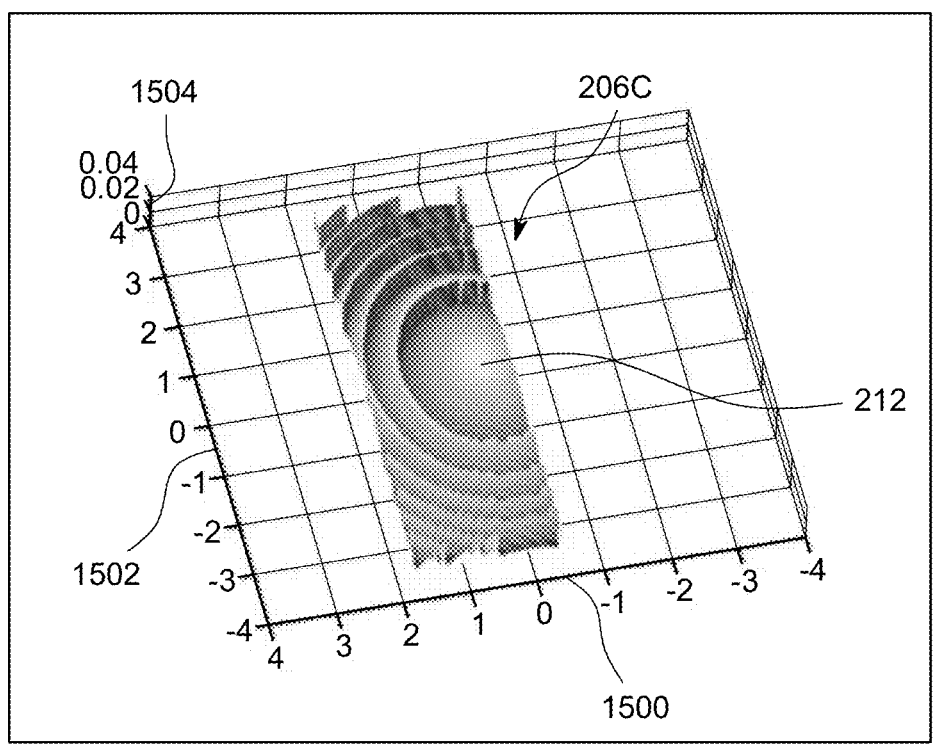
FIG. 20 illustrates a front surface of another lens element according to one example.
Figure 21:
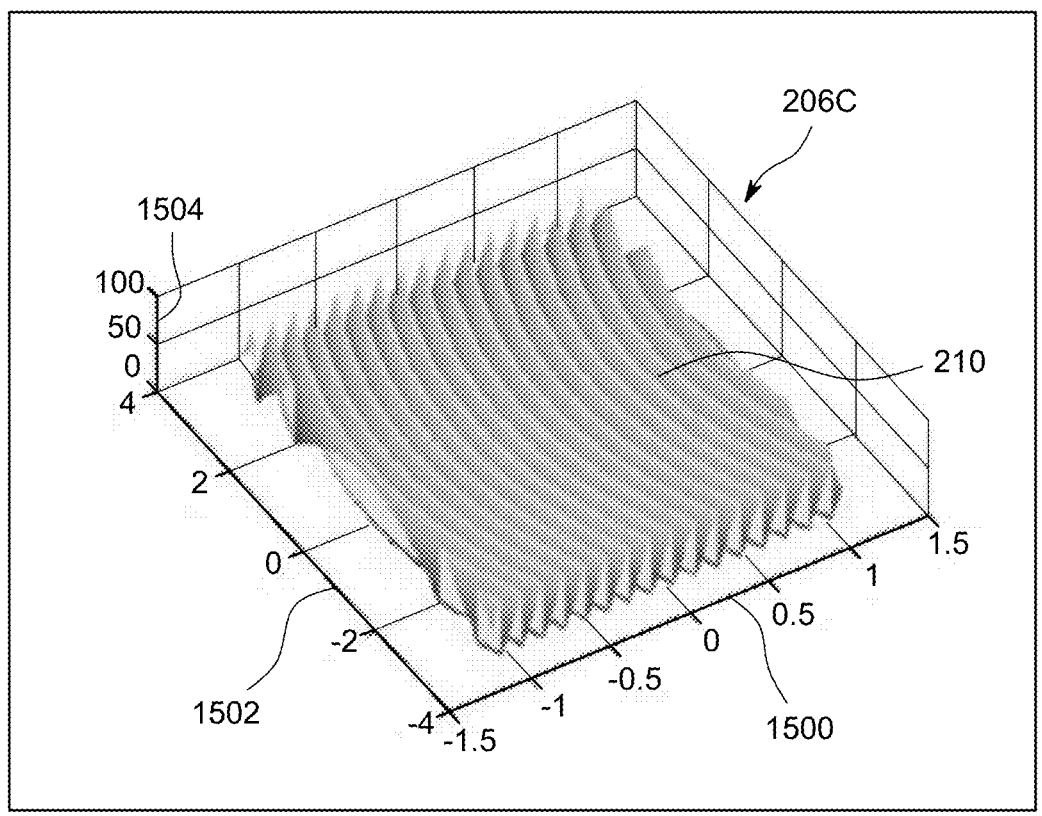
FIG. 21 illustrates a rear surface of the lens element shown in FIG. 20 according to one example.
Figure 22:
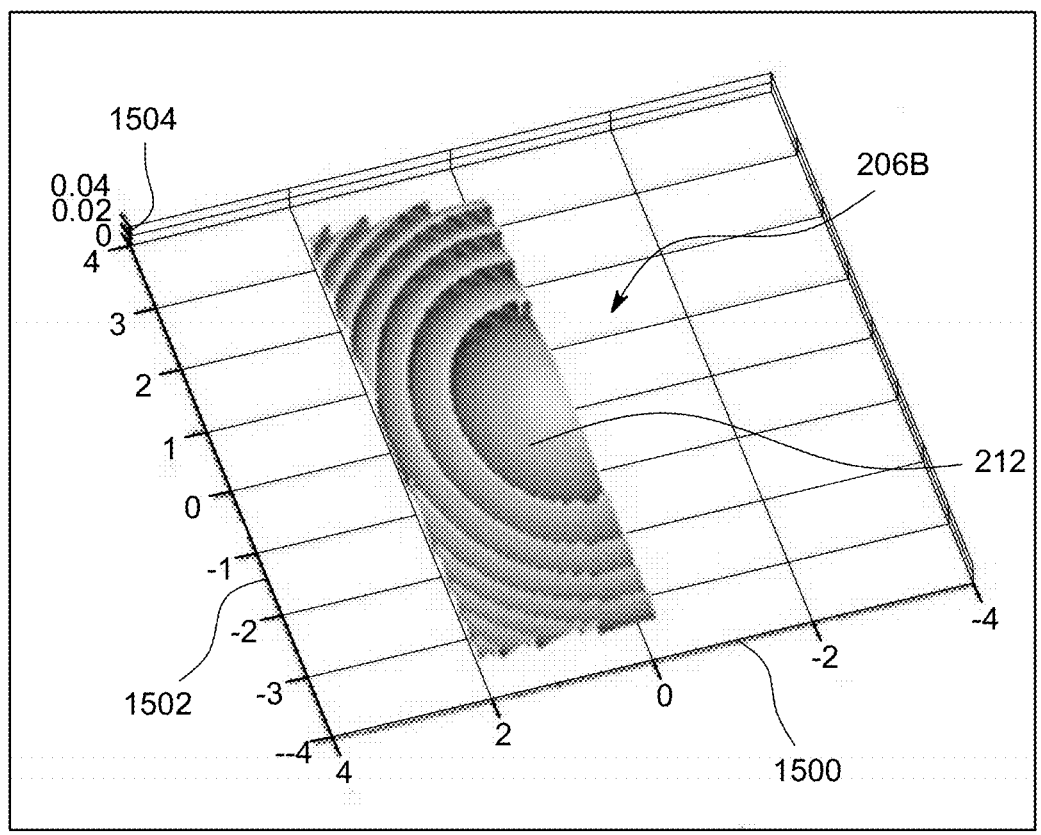
FIG. 22 illustrates a front surface of another lens element according to one example.
Figure 23:
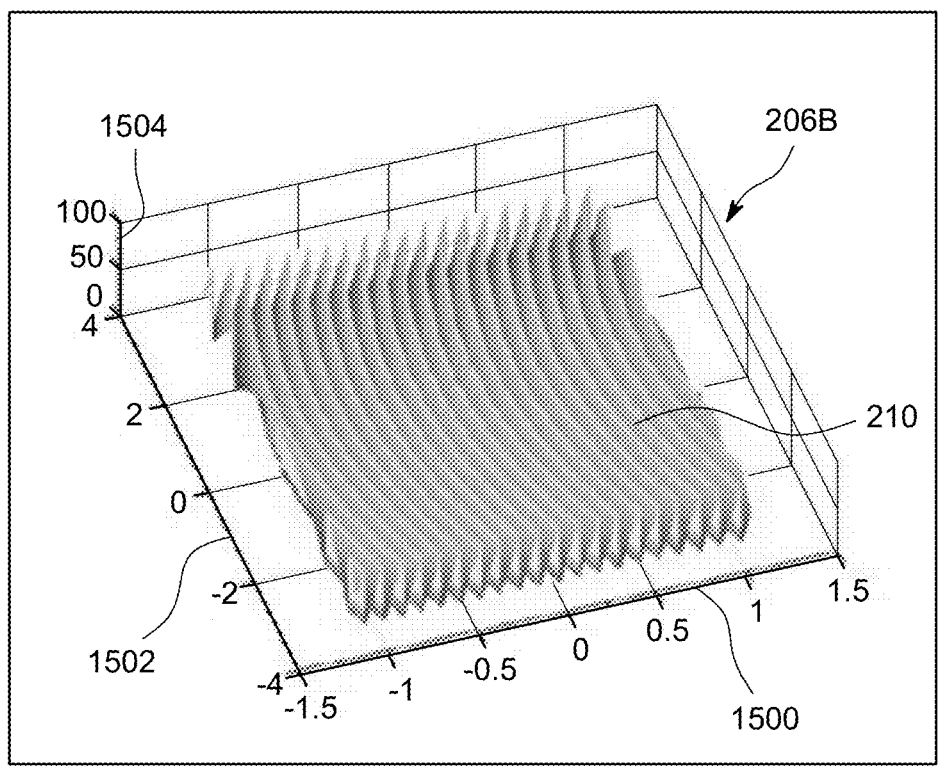
FIG. 23 illustrates a rear surface of the lens element shown in FIG. 22 according to one example.
Figure 24:
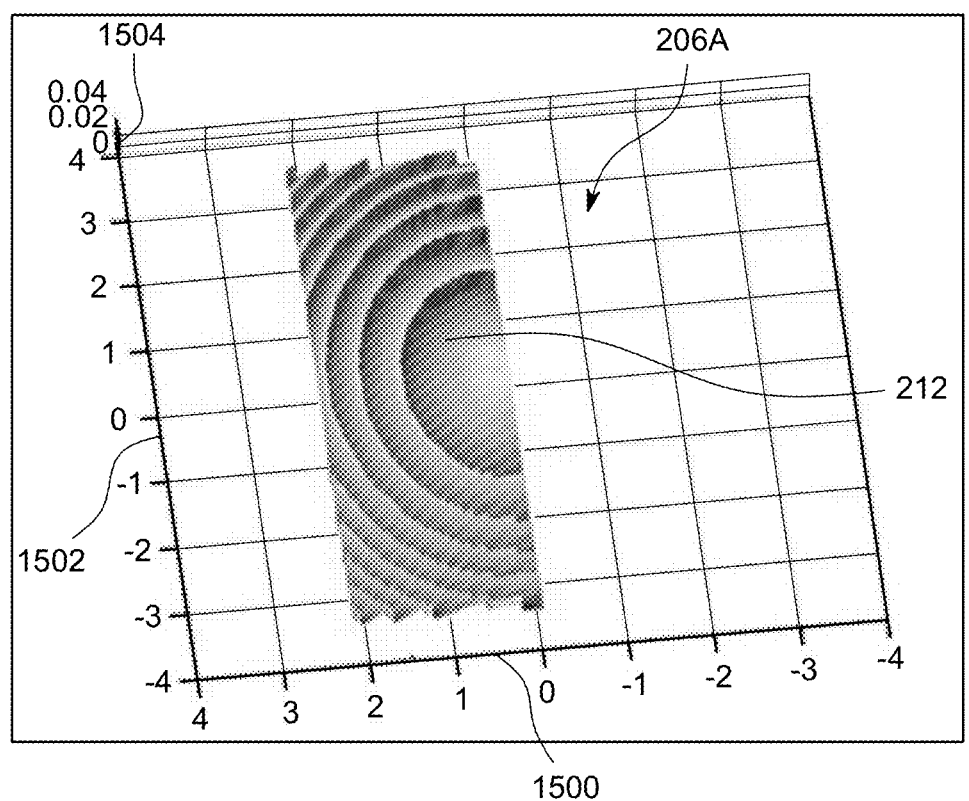
FIG. 24 illustrates a front surface of another lens element according to one example.
Figure 25:
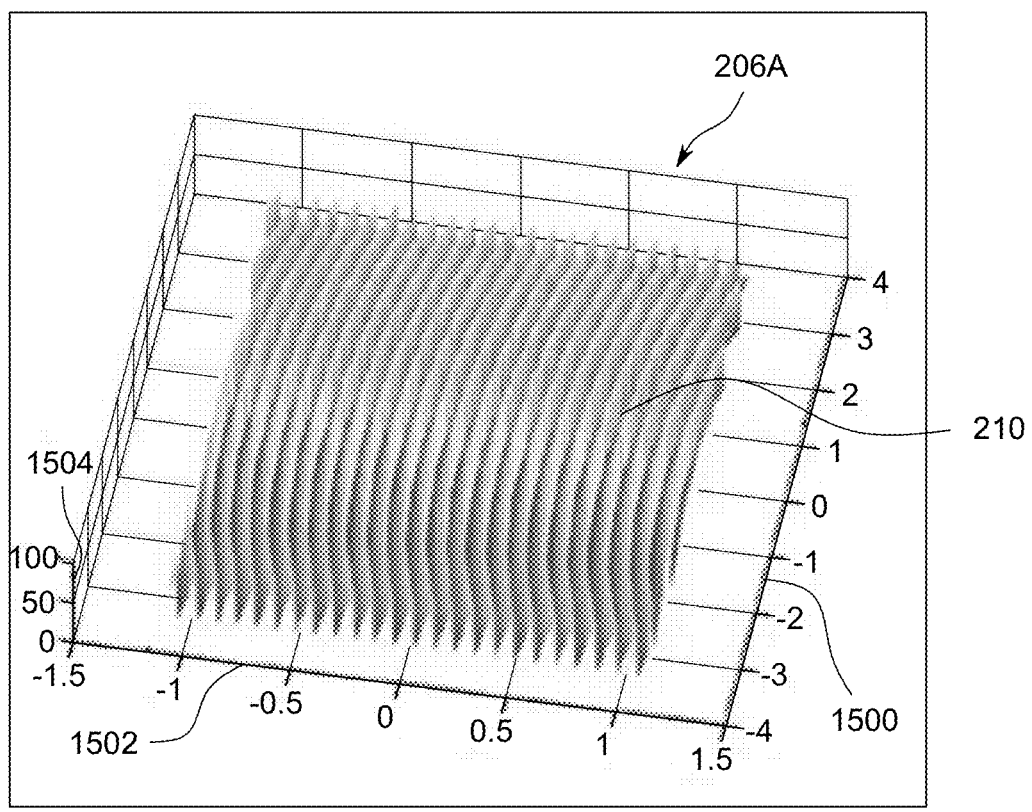
FIG. 25 illustrates a rear surface of the lens element shown in FIG. 24 according to one example.

FIGS. 14 through 25 illustrate front and rear surfaces 212, 210 of the lens elements 206 according to one example. FIG. 14 illustrates the front surface 212 of the lens element 206F and FIG. 15 illustrates the back surface 210 of the lens element 206F. FIG. 16 illustrates the front surface 212 of the lens element 206E and FIG. 17 illustrates the back surface 210 of the lens element 206E. FIG. 18 illustrates the front surface 212 of the lens element 206D and FIG. 19 illustrates the back surface 210 of the lens element 206D. FIG. 20 illustrates the front surface 212 of the lens element 206C and FIG. 21 illustrates the back surface 210 of the lens element 206C. FIG. 22 illustrates the front surface 212 of the lens element 206B and FIG. 23 illustrates the back surface 210 of the lens element 206B. FIG. 24 illustrates the front surface 212 of the lens element 206A and FIG. 25 illustrates the back surface 210 of the lens element 206A.

The front surfaces 212 and the rear surfaces 210 of the lens elements 206A-F are shown alongside a first axis 1500 representative of horizontal distances along the horizontal direction 216 from a vertical center line of the lens element 206, a perpendicular second axis 1502 representative of vertical distances along the vertical direction 214 from a horizontal center line of the lens element 206, and a perpendicular third axis 1504 representative of thickness of the lens element 206 from the center of the lens element 206. The units of the axes 1500, 1502, 1504 are millimeters.

The front surfaces 212 of the lens elements 206A-F are biconic surfaces that refract the portion of the outgoing light emanating from the lens elements 206. These surfaces are curved along two different directions with different radii of curvature in each direction in one embodiment. The front and rear surfaces 212, 210 of the lens elements 206 are formed as Fresnel lenses or lenslets to reduce the needed thickness of the lens elements 206. In one embodiment, each of the front and rear surfaces 212, 210 are a fifth order diffractive Fresnel lens.

In one embodiment, a lens array assembly is provided that includes plural lens elements each configured to receive incoming light from one or more light sources. The lens elements include biconic refractive elements on first sides of the lens elements and including diffractive elements on opposite, second sides of the lens elements. The lens elements are configured to change directions of the incoming light received from the one or more light sources such that outgoing light emanating from the lens elements is collimated in a first direction but diverges along a different, second direction.

The lens elements can be configured to receive the incoming light from the one or more light sources through the diffractive elements of the lens element and the outgoing light emanates out of the lens elements from the biconic refractive elements of the lens elements. Optionally, each of the lens elements is configured to form a different diverging beam of the outgoing light. Each of the lens elements can be configured to form the diverging beam of the outgoing light such that the diverging beam emanating from each of the lens elements only partially overlaps the diverging beam emanating from at least one neighboring lens element of the lens elements. Each of the lens elements can be configured to form the diverging beam of the outgoing light such that the diverging beam emanating from each of the lens elements has a different central angle than the diverging beam emanating from other lens elements in the lens elements.

Optionally, the lens elements are configured to receive the incoming light from laser diodes as the light sources. Each of the lens elements can be configured to receive a portion of the incoming light from a different light source of the one or more light sources.

In one example, the lens elements are static, nonmoving bodies that change the directions of the incoming light received from the plural light sources. The lens elements do not move while diffracting and/or refracting the light such that the outgoing light emanating from the lens elements is collimated in the first direction but diverges along the second direction. The lens elements are disposed side-by-side along the second direction in one embodiment.

In one embodiment, a method (e.g., for providing a lens array assembly) includes obtaining a grayscale photomask, applying a photoresist to a first side of an optic body, forming one or more insoluble portions in the photoresist by exposing the photoresist to a developing light through the grayscale photomask, and exposing the one or more insoluble portions in the photoresist and one or more portions of the optic body on the first side that are outside of the one or more insoluble portions of the photoresist to an etchant. The etchant forms biconic refractive surfaces in plural lens elements on the first side of the optic body. The lens elements are configured to change directions of incoming light received from one or more light sources such that outgoing light emanating from the lens elements is collimated in a first direction but diverges along a different, second direction.

Optionally, the etchant forms the biconic refractive surfaces in the lens elements on the first side of the optic body such that different lens elements have different biconic refractive surfaces. Obtaining the grayscale photomask can include exposing high energy beam selective glass to one or more electron beams. In one embodiment, the etchant is a plasma etchant.

The lens elements that are formed by the etchant can be microlens elements having largest outside dimensions of no more than 3.4 millimeters in a first direction and no more than 2.2 millimeters in a different, second direction.

Exposing the one or more portions of the optic body to the etchant does not remove any more than 62.5 micrometers from the optic body in one embodiment. Exposing the one or more portions of the optic body to the etchant optionally removes no more than 32 micrometers from the optic body.

The method optionally can include obtaining a different grayscale photomask, applying additional photoresist to an opposite, second side of the optic body, forming one or more insoluble portions in the additional photoresist by exposing the photoresist to the developing light, and exposing the one or more insoluble portions in the photoresist and one or more portions of the optic body on the second side that are outside of the one or more insoluble portions of the photoresist to the etchant. The etchant forms diffractive surfaces in the lens elements on the second side of the optic body. Optionally, exposing the one or more portions of the optic body on the second side to the etchant removes no more than 3.2 micrometers from the optic body. Another embodiment for manufacturing the lens arrays is to use direct write printing of precursor lens materials on a substrate to form the desired diffractive shapes. The precursors can be sol-gel solutions or can contain nanoparticles that are subsequently thermally processed for form solid microlens parts. Yet another embodiment uses the method of nano-imprint lithography to form the micro lenses. In yet another embodiment, microcontact printing is used as a method of manufacturing the microlenses.

In one embodiment, a lens array assembly includes plural lens elements each configured to receive incoming light from one or more light sources. The lens elements include biconic refractive elements on first sides of the lens elements and including diffractive elements on opposite, second sides of the lens elements. The lens elements are configured to form different diverging beams of the outgoing light such that the diverging beams emanating from the lens elements have different central angles. The lens elements can be configured to form the diverging beams of the outgoing light such that the diverging beam emanating from each of the lens elements only partially overlaps the diverging beam emanating from at least one neighboring lens element of the lens elements.

As used herein, an element or step recited in the singular and proceeded with the word "a" or "an" should be understood as not excluding plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter set forth herein without departing from its scope. While the dimensions and types of materials described herein are intended to define the parameters of the disclosed subject matter, they are by no means limiting and are exemplary embodiments. Many other embodiments will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A lens array assembly comprising:
a single body lens array that forms plural lens elements each configured to receive incoming light from one or more light sources, the lens elements including biconic refractive elements on a first side of the single body lens array and including diffractive elements on an opposite, second side of the single body lens array,
wherein the lens elements are configured to change directions of the incoming light received via the first side of the single body lens array from the one or more light sources such that outgoing light emanating from the second side of the single body lens array is collimated in a first direction but diverges along a different, second direction.

2. The lens array assembly of claim 1, wherein the lens elements are configured to receive the incoming light from the one or more light sources through the diffractive elements and the outgoing light emanates out of the lens elements from the biconic refractive elements.

3. The lens array assembly of claim 1, wherein each of the lens elements is configured to form a different diverging beam of the outgoing light.

4. The lens array assembly of claim 3, wherein each of the lens elements is configured to form the diverging beam of the outgoing light such that the diverging beam emanating from each of the lens elements only partially overlaps the diverging beam emanating from at least one neighboring lens element of the lens elements.

5. The lens array assembly of claim 3, wherein each of the lens elements is configured to form the diverging beam of the outgoing light such that the diverging beam emanating from each of the lens elements has a different central angle than the diverging beam emanating from other lens elements in the lens elements.

6. The lens array assembly of claim 1, wherein the lens elements are configured to receive the incoming light from laser diodes as the light sources.

7. The lens array assembly of claim 1, wherein each of the lens elements is configured to receive a portion of the incoming light from a different light source of the one or more light sources.

8. The lens array assembly of claim 1, wherein the lens elements are static and do not move, but that change the directions of the incoming light received from the plural light sources such that the outgoing light emanating from the lens elements is collimated in the first direction but diverges along the second direction.

9. The lens array assembly of claim 1, wherein the lens elements are disposed side-by-side along the second direction.

10. A lens array assembly comprising:
a single body lens array forming plural lens elements each configured to receive incoming light from one or more light sources, the lens elements including biconic refractive elements on first sides of the lens elements and including diffractive elements on opposite, second sides of the lens elements,
wherein the lens elements are configured to form different diverging beams of the outgoing light such that the diverging beams emanating from the lens elements have different central angles.

11. The lens array assembly of claim 10, wherein the lens elements are configured to form the diverging beams of the outgoing light such that the diverging beam emanating from each of the lens elements only partially overlaps the diverging beam emanating from at least one neighboring lens element of the lens elements.

12. A lens assembly comprising:
a lens array formed from a single body in a shape of plural micro lenses, each of the micro lenses having a biconic refractive element on a first side of the lens array and a diffractive element on an opposite, second side of the lens array,
wherein the micro lenses are configured to change directions of incoming light received via the first side of the lens array from light sources such that outgoing light emanating from the second side of the lens array is collimated in a first direction but diverges along a different, second direction.

13. The lens assembly of claim 12, wherein the micro lenses are configured to receive the incoming light from the light sources through the diffractive elements and the outgoing light emanates out of the micro lenses from the biconic refractive elements.

14. The lens assembly of claim 12, wherein each of the micro lenses is configured to form a differently shaped diverging beam of the outgoing light such that the diverging beam from each of the micro lenses does not completely overlap the diverging beam from any other of the micro lenses.

15. The lens assembly of claim 14, wherein each of the micro lenses is configured to form the diverging beam of the outgoing light such that the diverging beam emanating from each of the micro lenses has a different central angle than the diverging beam emanating from all other micro lenses.

16. The lens assembly of claim 12, wherein the micro lenses are configured to receive the incoming light from laser diodes.

17. The lens assembly of claim 12, wherein each of the micro lenses is configured to receive a portion of the incoming light from a different light source.

18. The lens assembly of claim 12, wherein the micro lenses are static and do not move, but that change the directions of the incoming light such that the outgoing light emanating from the lens elements is collimated in the first direction but diverges along the second direction.

19. The lens assembly of claim 12, wherein the micro lenses are disposed side-by-side along the second direction.

* * * * *